(12) United States Patent
Lai et al.

(10) Patent No.: US 11,406,050 B2
(45) Date of Patent: Aug. 2, 2022

(54) FLOATED-TYPE SHIELDING MECHANISM AND CIRCUIT BOARD MODULE

(71) Applicant: GIGA-BYTE TECHNOLOGY CO., LTD., New Taipei (TW)

(72) Inventors: Chih-Ming Lai, New Taipei (TW); Yung-Shun Kao, New Taipei (TW); Tzu-Hsiang Huang, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/920,355

(22) Filed: Jul. 2, 2020

(65) Prior Publication Data
US 2021/0219471 A1   Jul. 15, 2021

(30) Foreign Application Priority Data
Jan. 15, 2020   (TW) .................. 109101346

(51) Int. Cl.
*H05K 9/00*   (2006.01)

(52) U.S. Cl.
CPC .................. *H05K 9/0032* (2013.01)

(58) Field of Classification Search
CPC ........................... H05K 9/002–0035
See application file for complete search history.

(56) References Cited

U.S. PATENT DOCUMENTS

| | | | | |
|---|---|---|---|---|
| 5,392,192 A * | 2/1995 | Dunn | ...... | G06F 1/181 174/384 |
| 5,684,271 A * | 11/1997 | Scholder | ...... | G06F 1/182 174/382 |
| 5,822,182 A * | 10/1998 | Scholder | ...... | G06F 1/183 361/679.57 |
| 6,252,160 B1 * | 6/2001 | Chang | ...... | H05K 9/0016 174/377 |
| 6,477,061 B1 * | 11/2002 | Johnson | ...... | G06F 1/182 174/351 |
| 7,606,044 B2 * | 10/2009 | Bailey | ...... | G06F 1/182 361/752 |

(Continued)

FOREIGN PATENT DOCUMENTS

CN           105898980           8/2016

OTHER PUBLICATIONS

"Office Action of Taiwan Counterpart Application", dated Nov. 18, 2021, p. 1-p. 6.

*Primary Examiner* — Jacob R Crum
(74) *Attorney, Agent, or Firm* — JCIPRNET (57) ABSTRACT

A floated-type shielding mechanism including a cover, a shielding sheet, and a flexible conductor is provided. The cover is adapted to be fixed to a circuit board and covers a plurality of input/output (IO) ports of the circuit board. The shielding sheet is movably disposed at the cover and a back plate, and has a plurality of openings respectively corresponding to the IO ports. The flexible conductor deformably protrudes from an inner surface of the shielding sheet and is adapted to contact the IO ports. When the circuit board, the back plate, and the floated-type shielding mechanism are assembled into a case, the IO ports are exposed from a case opening and the flexible conductor is adapted to be deformed by pressing so that the shielding sheet presses against an inner wall surface around the case opening.

14 Claims, 8 Drawing Sheets

(56) References Cited

U.S. PATENT DOCUMENTS

| | | | | |
|---|---|---|---|---|
| 9,927,849 | B1* | 3/2018 | Lai | G06F 1/182 |
| 9,996,123 | B1* | 6/2018 | Chung | G06F 1/186 |
| 2005/0265003 | A1* | 12/2005 | Coglitore | H05K 9/0018 |
| | | | | 361/724 |
| 2010/0254112 | A1* | 10/2010 | Brown | G02B 6/4201 |
| | | | | 361/818 |
| 2019/0229473 | A1 | 7/2019 | Lee et al. | |

* cited by examiner

FLOATED-TYPE SHIELDING MECHANISM AND CIRCUIT BOARD MODULE

CROSS-REFERENCE TO RELATED APPLICATION

This application claims the priority benefit of Taiwan application serial no. 109101346, filed on Jan. 15, 2020. The entirety of the above-mentioned patent application is hereby incorporated by reference herein and made a part of this specification.

BACKGROUND OF THE INVENTION

1. Field of the Invention

The invention relates to a shielding mechanism and a circuit board module, and in particular, to a floated-type shielding mechanism and a circuit board module.

2. Description of Related Art

At present, quite a few motherboards are integrated with an input/output (IO) shielding mechanism, that is, the IO shielding mechanism is directly locked to the motherboard and then is assembled into a case together with the motherboard. However, after the motherboard is locked into the case, the IO shielding mechanism may be affected by a tolerance and cannot be well connected to the case, resulting in poor electromagnetic shielding.

SUMMARY OF THE INVENTION

The invention provides a floated-type shielding mechanism, and the floated-type shielding mechanism can move relative to a circuit board assembly to be well connected to a case when being fixed to the case together with the circuit board assembly, thereby providing a good electromagnetic shielding effect.

The invention provides a circuit board module having the above-mentioned floated-type shielding mechanism.

A floated-type shielding mechanism of the invention is adapted to be assembled onto a circuit board assembly and is assembled into a case together with the circuit board assembly, the circuit board assembly including a circuit board and a back plate fixed to a bottom surface of the circuit board, the circuit board including a plurality of IO ports on a top surface, the case including a case opening, and the floated-type shielding mechanism including a cover, a shielding sheet, and a flexible conductor. The cover is adapted to be fixed to the circuit board, and the cover is located on the top surface and covers the IO ports. The shielding sheet is movably disposed at the cover and the back plate and has a plurality of openings respectively corresponding to the IO ports. The flexible conductor protrudes from an inner surface of the shielding sheet and is adapted to be deformed, and is adapted to contact the IO ports. When the circuit board assembly and the floated-type shielding mechanism are assembled into the case, the IO ports are exposed from the case opening, and the flexible conductor is adapted to be deformed by pressing so that the shielding sheet presses against an inner wall surface of the case around the case opening.

In an embodiment of the invention, the shielding sheet includes a main sheet body and a top sheet body bendably connected to the main sheet body, the IO ports being located on the main sheet body, a first protrusion being provided on one of portions of the top sheet body and the cover that face each other, a first opening being provided on the other of the portions, and the first protrusion being movably disposed in the first opening along a moving direction.

In an embodiment of the invention, the first protrusion is integrally disposed on the cover, and the first opening is an elongated hole, an oval hole, or a round hole.

In an embodiment of the invention, the shielding sheet includes a main sheet body and a bottom sheet body bendably connected to the main sheet body, the IO ports being located on the main sheet body, the bottom sheet body being located between the back plate and the circuit board, a second protrusion being provided on one of portions of the bottom sheet body and the back plate that face each other, a second opening being provided on the other of the portions, and the second protrusion being movably disposed in the second opening along a moving direction.

In an embodiment of the invention, the bottom sheet body has a screw hole, and the second protrusion includes a nut, a boss, and a screw body connected in sequence, the screw body of the second protrusion being screwed to the screw hole of the bottom sheet body, and the boss passing through the second opening on the back plate and abutting against the bottom sheet body.

In an embodiment of the invention, the second opening is an elongated hole or an oval hole, a size of the nut is greater than a width of the second opening, and the width and a length of the second opening are greater than a size of the boss.

In an embodiment of the invention, the second opening is a round hole, a size of the nut is greater than a size of the second opening, and the size of the second opening is greater than a size of the boss.

In an embodiment of the invention, the flexible conductor is a conductive foam.

In an embodiment of the invention, the flexible conductor is a bent elastic piece folded out of a part of the shielding sheet.

A circuit board module of the invention is adapted to be assembled into a case, the case including a case opening on a first wall and a case fixing hole on a second wall, and the circuit board module including a circuit board, a back plate, and a floated-type shielding mechanism. The circuit board includes a penetrating circuit board fixing hole and a plurality of IO ports on a top surface. The back plate is fixed to a bottom surface of the circuit board. The floated-type shielding mechanism is disposed on the circuit board and the back plate. When the circuit board, the back plate, and the floated-type shielding mechanism are assembled into the case, the flexible conductor is adapted to be deformed by pressing so that the circuit board fixing hole is aligned with the case fixing hole and the shielding sheet presses against an inner wall surface of the case around the case opening.

Based on the above, the floated-type shielding mechanism of the invention is movably disposed on the cover and the back plate through the shielding sheet, and the flexible conductor protrudes from the inner surface of the shielding sheet and is adapted to be deformed. When the circuit board assembly and the floated-type shielding mechanism are assembled into the case, the flexible conductor is adapted to be deformed by pressing and the shielding sheet can move relative to the circuit board, so that the shielding sheet presses against the inner wall surface of the case around the case opening.

DESCRIPTION OF THE EMBODIMENTS

Figure 1:
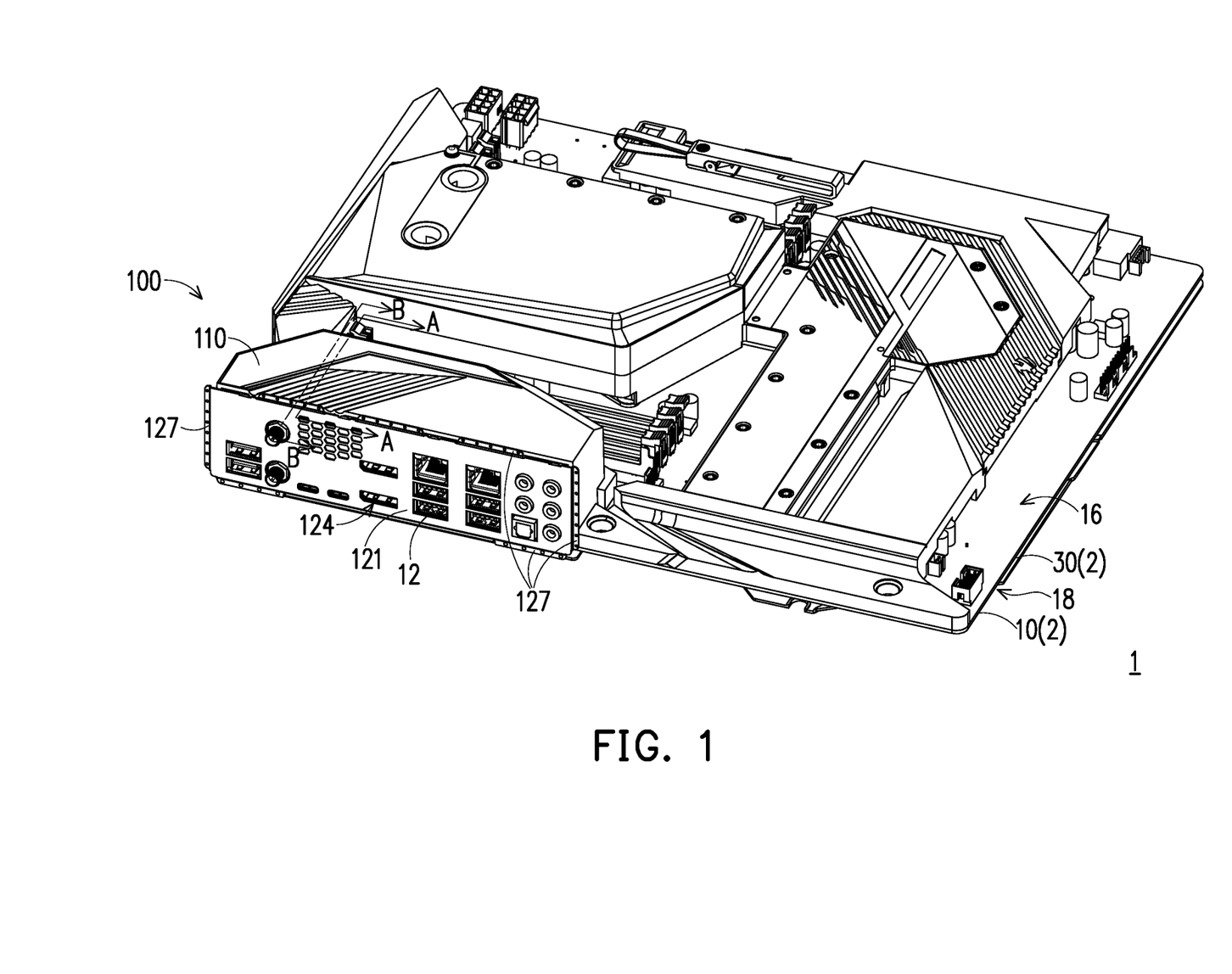
FIG. 1 is a schematic diagram of a circuit board module according to an embodiment of the invention.

FIG. 1 is a schematic diagram of a circuit board module according to an embodiment of the invention. Referring to FIG. 1, a circuit board module 1 in the present embodiment is adapted to be assembled into a case 20 (shown in FIG. 5). The circuit board module 1 includes a circuit board assembly 2 and a floated-type shielding mechanism 100. The circuit board assembly 2 includes a circuit board 10 and a back plate 30 fixed to a bottom surface 18 of the circuit board 10. The floated-type shielding mechanism 100 is located on a top surface 16 of the circuit board 10.

The circuit board 10 includes a plurality of IO ports 12 on the top surface 16. The floated-type shielding mechanism 100 is movably disposed on the circuit board 10 and the back plate 30 and covers the IO ports 12 of the circuit board 10.

Compared with the situation that after the shielding mechanism is assembled into the case together with the circuit board due to a tolerance, the shielding mechanism cannot press against the case well, in the present embodiment, the floated-type shielding mechanism 100 can slightly move relative to the circuit board 10, so that after the floated-type shielding mechanism 100 is assembled into the case 20 together with the circuit board 10 and the back plate 30, an abutting portion 127 of the floated-type shielding mechanism 100 can press against the case 20 to achieve a good electromagnetic shielding effect. This is explained below.

Figure 2:
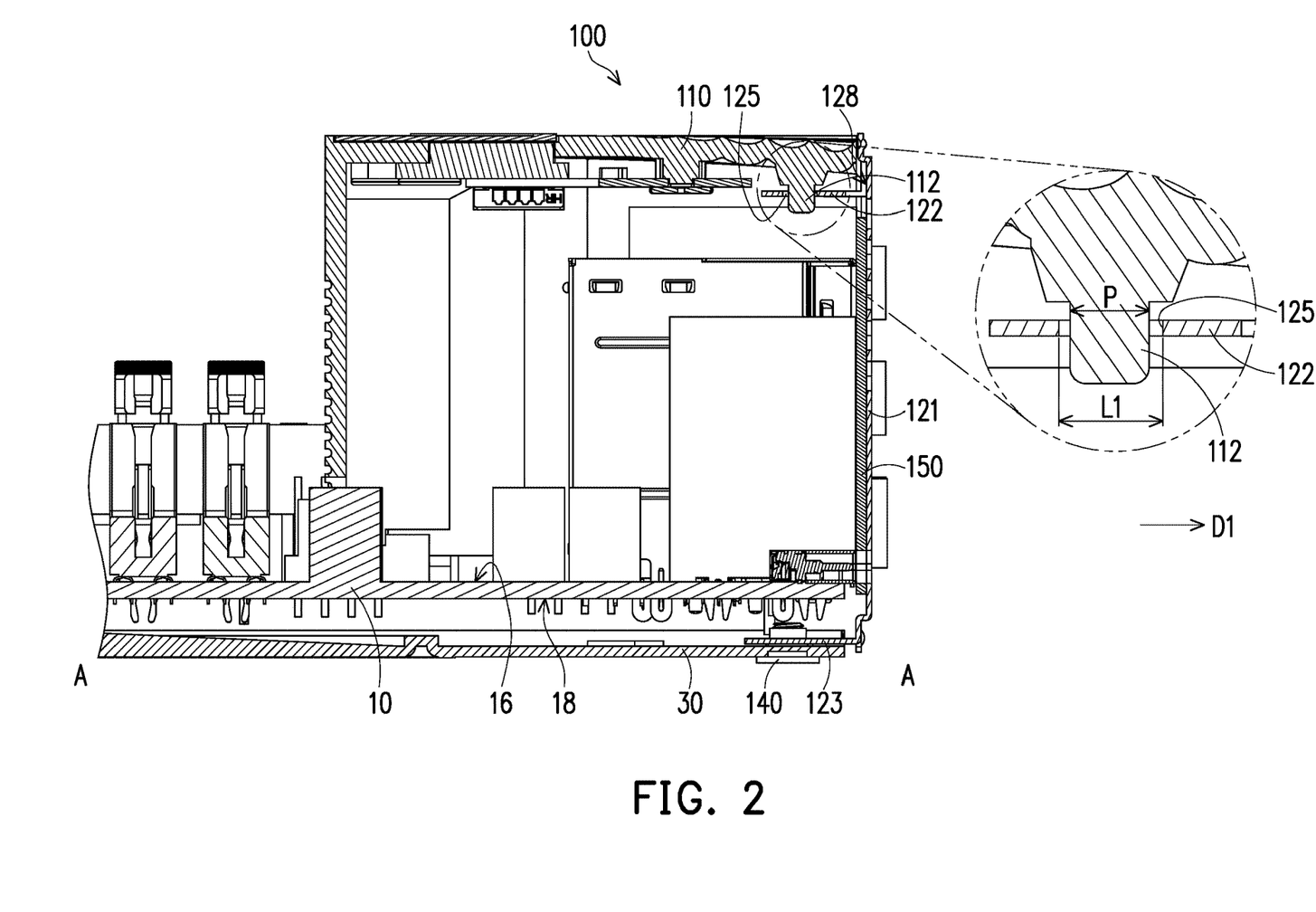
FIG. 2 is a schematic partial cross-sectional view along a line A-A in FIG. 1.
Figure 3:
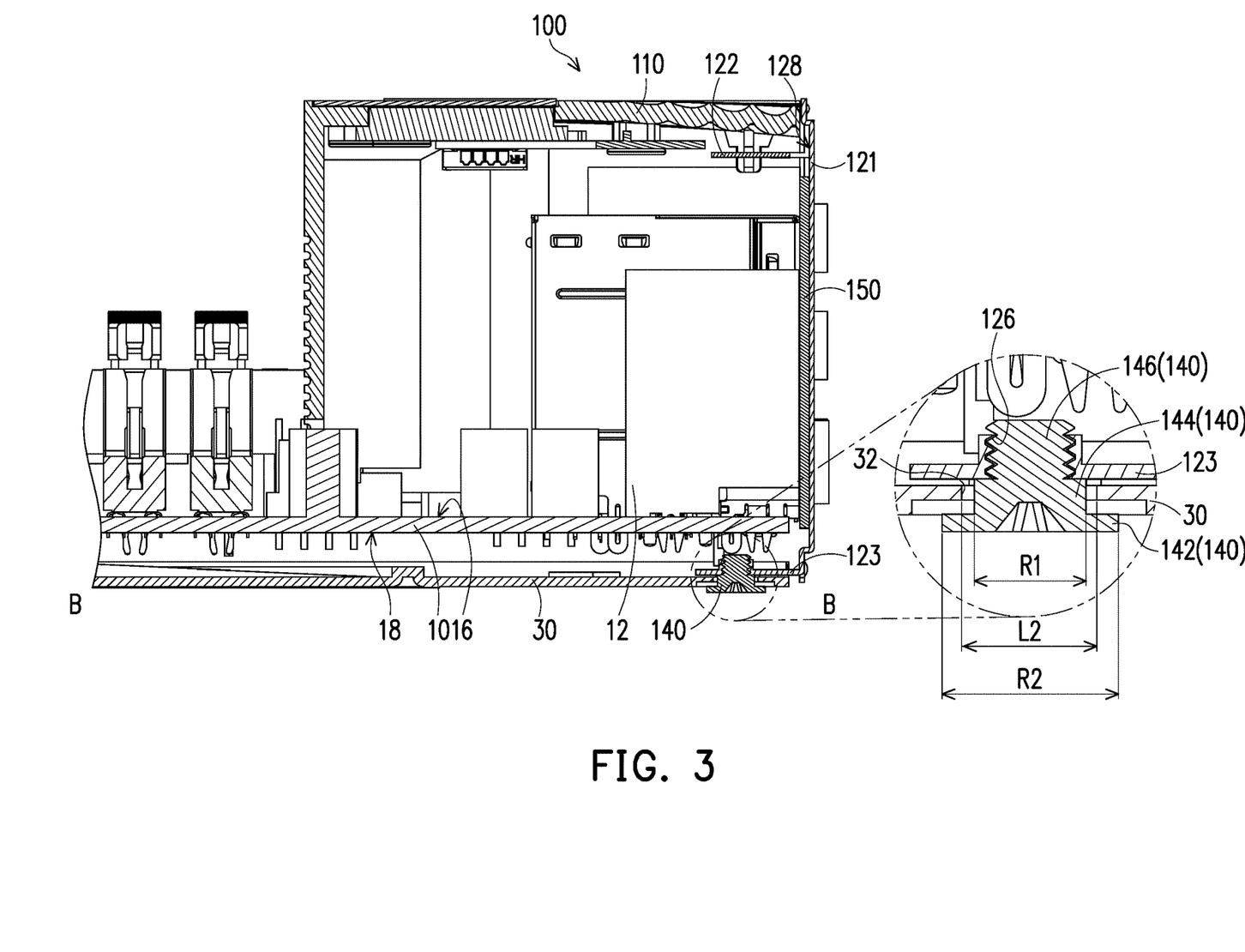
FIG. 3 is a schematic partial cross-sectional view along a line B-B in FIG. 1.
Figure 4A:
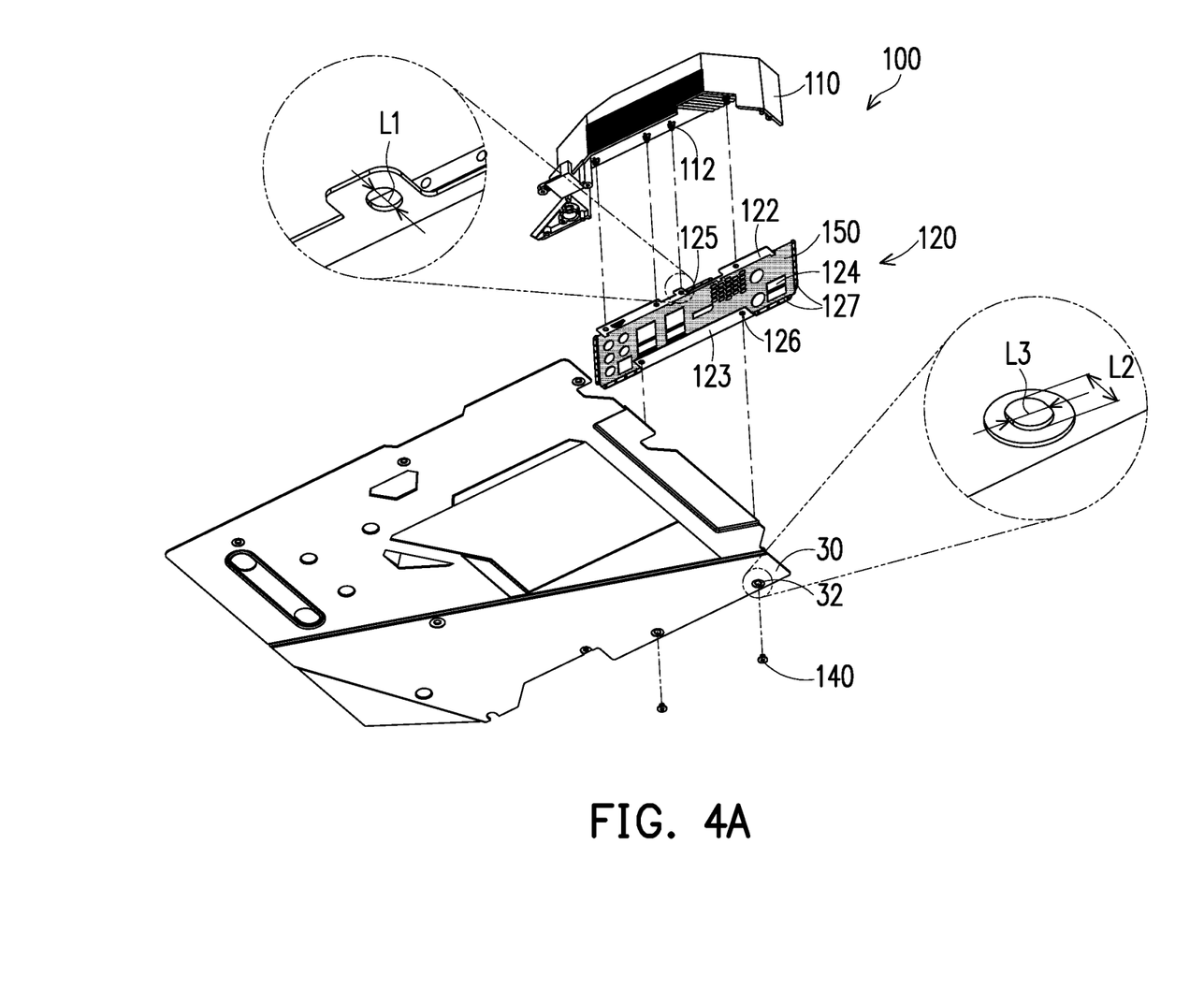
FIG. 4A is an exploded view of a floated-type shielding mechanism and a back plate in FIG. 1.

FIG. 2 is a schematic partial cross-sectional view along a line A-A in FIG. 1. FIG. 3 is a schematic partial cross-sectional view along a line B-B in FIG. 1. FIG. 4A is an exploded view of a floated-type shielding mechanism and a back plate in FIG. 1.

Referring to FIG. 2 to FIG. 4A, the floated-type shielding mechanism 100 includes a cover 110, a shielding sheet 120, and a flexible conductor 150. The cover 110 is disposed on the circuit board 10 and is located on a top surface 16 of the circuit board 10, and covers the IO ports 12.

The shielding sheet 120 is movably disposed at the cover 110 and the back plate 30 along a moving direction D1. In particular, the shielding sheet 120 includes a main sheet body 121, a top sheet body 122 and a bottom sheet body 123 bendably connected to the main sheet body 121, and a plurality of abutting portions 127 surrounding the main sheet body 121.

The main sheet body 121 of the shielding sheet 120 has a plurality of openings 124 respectively corresponding to the IO ports 12. The top sheet body 122 and the bottom sheet body 123 are respectively located at two opposite ends of the main sheet body 121. The top sheet body 122 is next to the cover 110, and the bottom sheet body 123 is next to the back plate 30. The abutting portion 127 is configured to press against a portion of the case 10 around the case opening 24.

As shown in FIG. 2, a first protrusion 112 is provided on one of portions of the top sheet body 122 and the cover 110 that face each other, and a first opening 125 is provided on the other of the portions. The first protrusion 112 is movably disposed in the first opening 125 along the moving direction D1.

In particular, in the present embodiment, the top sheet body 122 has the first opening 125 and the cover body 110 has the first protrusion 112. Certainly, in other embodiments, the top sheet body 122 may have the first protrusion 112, and the cover 110 may have the first opening 125.

In the present embodiment, the first protrusion 112 is integrally disposed on the cover 110, but the first protrusion 112 may be alternatively disposed on the cover 110 through locking, riveting, clamping, or bonding. The invention is not limited to the foregoing manners.

In addition, as shown in FIG. 4A, in the present embodiment, the first opening 125 is an elongated hole or an oval hole. A length size L1 of the first opening 125 is greater than a size P (FIG. 2) of the first protrusion 112, so that the first protrusion 112 can slide within the first opening 125. Therefore, the shielding sheet 120 can move relative to the cover 110. Certainly, a form of the first opening 125 is not limited to this.

Figure 4B:
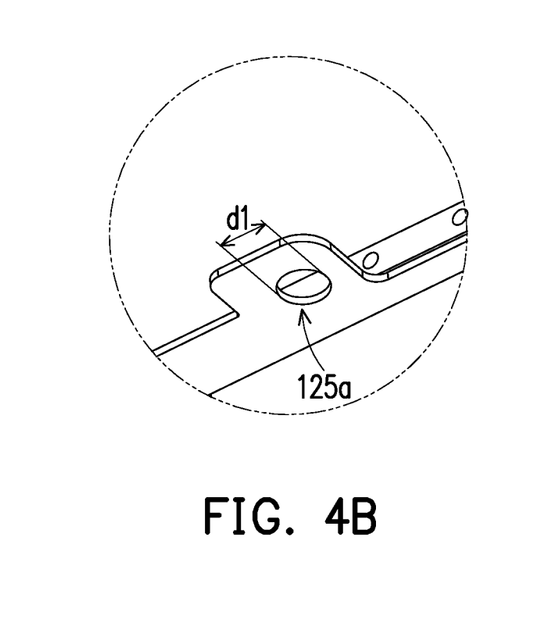
FIG. 4B is a schematic diagram of a first opening of a floated-type shielding mechanism according to another embodiment of the invention.

FIG. 4B is a schematic diagram of a first opening of a floated-type shielding mechanism according to another embodiment of the invention. Referring to FIG. 4B, in the present embodiment, the first opening 125a is a round hole. A diameter size d1 of the first opening 125a is greater than a size P of the first protrusion 112 (FIG. 2). Therefore, the first protrusion 112 can also move relative to the first opening 125a.

Referring again to FIG. 3, the bottom sheet body 123 is located between the back plate 30 and the circuit board 10, a second protrusion 140 is provided on one of portions of the bottom sheet body 123 and the back plate 30 that face each other, a second opening 32 is provided on the other of the portions, and the second protrusion 140 is movably disposed in the second opening 32 along the moving direction D1.

In particular, in the present embodiment, the back plate 30 has the second opening 32, and the second protrusion 140 is provided on the bottom sheet body 123. Certainly, in other embodiments, the back plate 30 may be disposed on the bottom sheet body 123, and the second protrusion 140 may have the second opening 32.

Still further, in the present embodiment, the bottom sheet body 123 has a screw hole 126, and the second protrusion 140 includes a nut 142, a boss 144, and a screw body 146 connected in sequence. The screw body 146 of the second protrusion 140 is screwed to the screw hole 126 of the bottom sheet body 123, and the boss 144 presses against the bottom sheet body 123, so that the second protrusion 140 is firmly fixed to the bottom sheet body 123 of the shielding plate 120.

In the present embodiment, when the floated-type shielding mechanism 100 is being assembled, the first protrusion 112 can be firstly inserted into the first opening 125, and then the second protrusion 140 can pass through the second opening 32 on the back plate 30 and is screwed to the screw hole 126 of the bottom sheet body 123. In other words, the second protrusion 140 adopts a design similar to a screw, to improve assembly convenience of the floated-type shielding mechanism 100.

Certainly, in other embodiments, the second protrusion 140 may also be integrally disposed on the bottom sheet body 123, for example, formed in a convex or folded manner. The invention is not limited to the foregoing manners.

In addition, in the present embodiment, as shown in FIG. 4A, the second opening 32 is an elongated hole or an oval hole. As shown in FIG. 3, a length size L2 and a width size L3 (FIG. 4A) of the second opening 32 are greater than a size R1 of the boss 144 of the second protrusion 140, so that the boss 144 of the second protrusion 140 can move within the second opening 32. Certainly, a shape of the second opening 32 is not limited to this.

In addition, in the present embodiment, a size R2 of the nut 142 is greater than the width size L3 (shown in FIG. 4A) of the second opening 32, and therefore a portion that is of the back plate 30 and that is close to the second opening 32 is not protruded from the bottom sheet body 123 and the second protrusion 140.

Figure 4C:
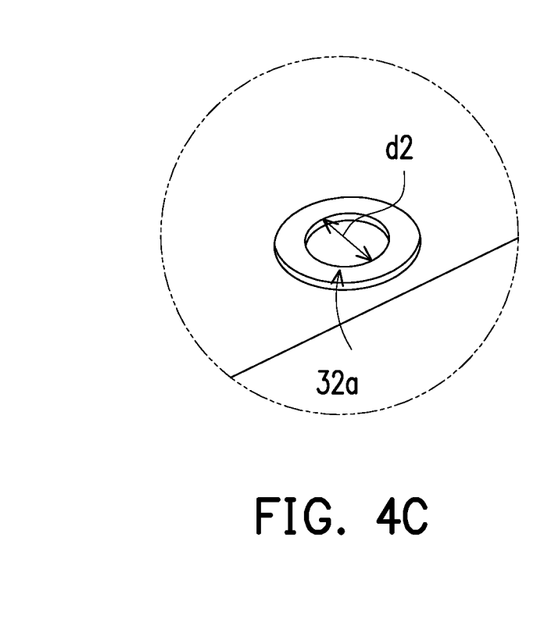
FIG. 4C is a schematic diagram of a second opening of a floated-type shielding mechanism according to another embodiment of the invention.

FIG. 4C is a schematic diagram of a second opening of a floated-type shielding mechanism according to another embodiment of the invention. Referring to FIG. 4C, in the present embodiment, the second opening 32a is a round hole. A diameter size d2 of the second opening 32a is greater than a size R1 (FIG. 3) of the boss 144, so that the boss 144 of the second protrusion 140 can move within the second opening 32a.

In addition, a size R2 of the nut 142 is greater than the diameter size d2 of the second opening 32, and therefore a portion that is of the back plate 30 and that is close to the second opening 32a is not protruded from the bottom sheet body 123 and the second protrusion 140.

In addition, as shown in FIG. 3, in the present embodiment, the flexible conductor 150 protrudes from an inner surface 128 of the shielding sheet 120 and is adapted to be deformed, and is adapted to contact the IO ports 12. Therefore, the flexible conductor 150 can be deformed by pressing so that the IO ports 12 on the circuit board 10 are relatively close to the shielding sheet 120. In the present embodiment, the flexible conductor 150 is, for example, a conductive foam that can be deformed by pressing and is conductive, but the flexible conductor 150 is not limited thereto.

Figure 5:
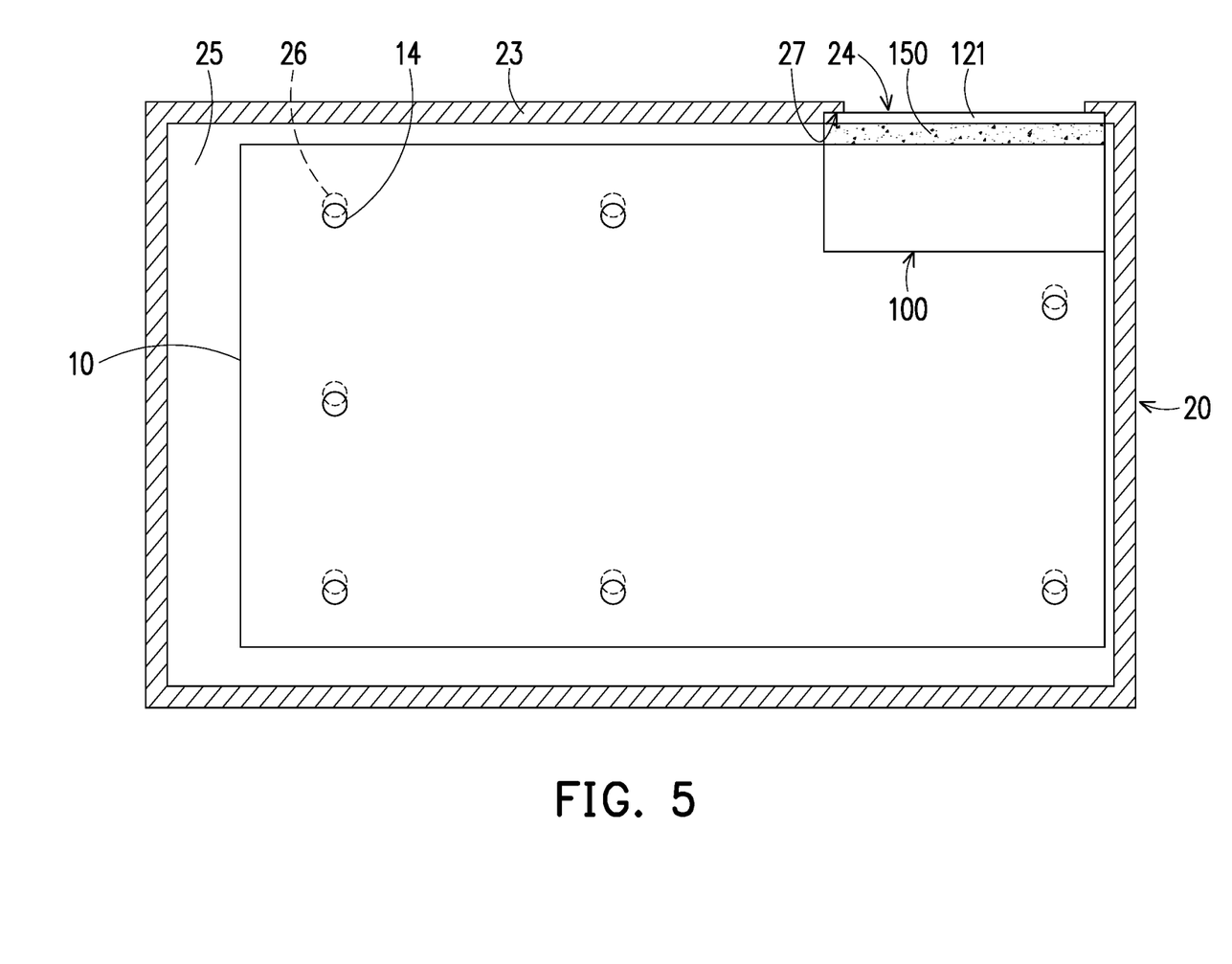
FIG. 5 and FIG. 6 are schematic top views of assembling a circuit board module in FIG. 1 into a case.
Figure 6:
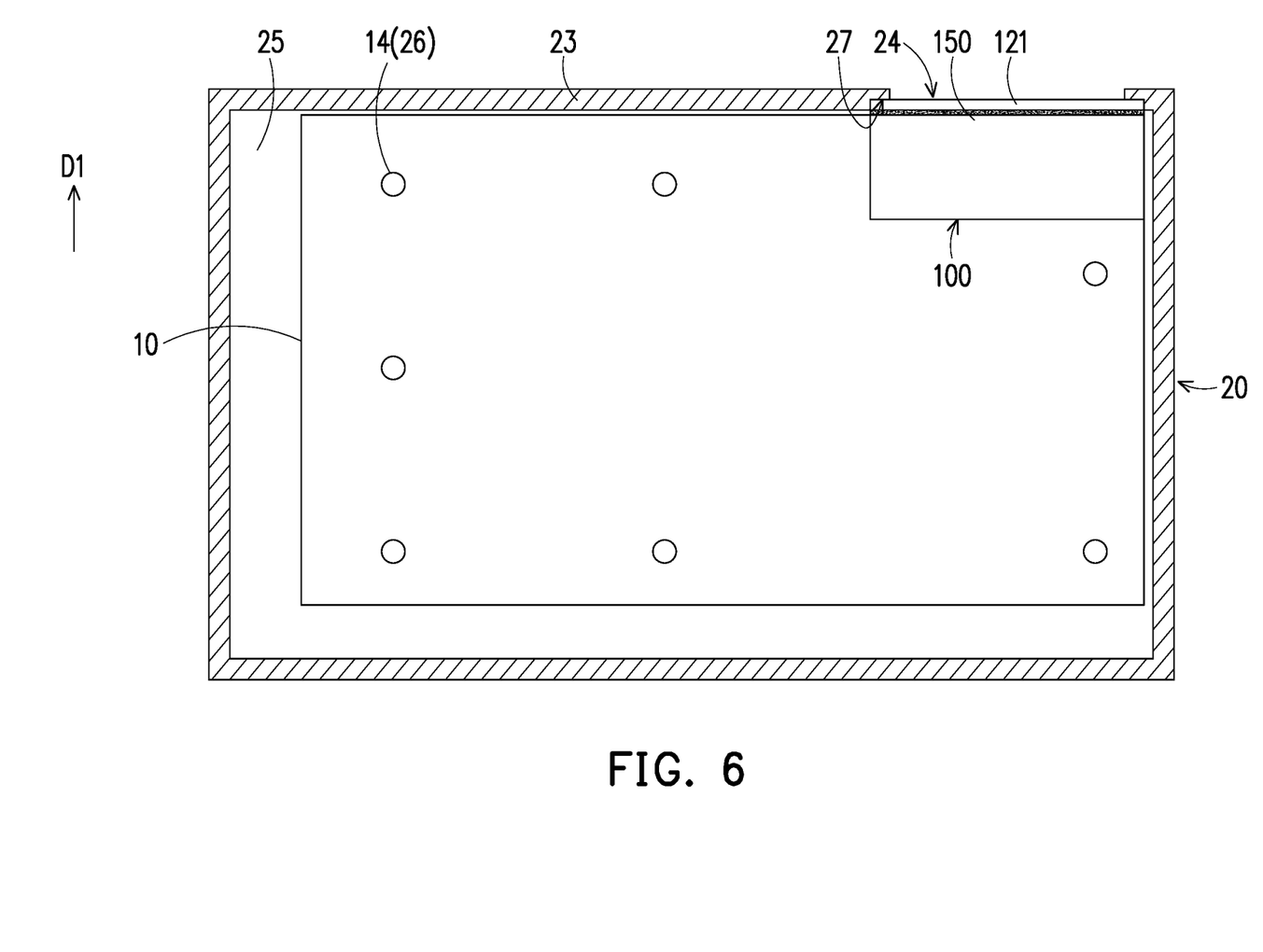

FIG. 5 and FIG. 6 are schematic top views of assembling a circuit board module in FIG. 1 into a case. It should be noted that FIG. 5 and FIG. 6 are merely schematic diagrams, and reference is also made to FIG. 1 to FIG. 4A. Referring first to FIG. 5, in the present embodiment, the case 20 includes a case opening 24 on a first wall 23 and a case fixing hole 26 on a second wall 25. The circuit board 10 includes a penetrating circuit board fixing hole 14.

When the circuit board 10 and the floated-type shielding mechanism 100 are assembled into the case 20, the circuit board fixing holes 14 needs to be aligned with the case fixing hole 26, so that a screw (not shown) can fix the circuit board 10 to the case 20.

However, it can be learned from FIG. 5 that when the circuit board 10 and the floated-type shielding mechanism 100 are assembled into the case 20, the shielding sheet 120 presses against an inner wall surface 27 of the case around the case opening 24. However, the circuit board fixing hole 14 cannot be aligned with the case fixing hole 26, and therefore the circuit board 10 cannot be fixed to the case 20.

Referring to FIG. 6, in the present embodiment, the flexible conductor 150 is adapted to be deformed. Therefore, as long as an assembler pushes the circuit board 10 toward the first wall 23 of the case 20 along the moving direction D1, the flexible conductor 150 is deformed, to make room for the circuit board fixing holes 14 to be aligned with case fixing holes 26. In this way, the circuit board fixing hole 14 can be aligned with the case fixing hole 26, and the screw can pass through the circuit board fixing hole 14 and the case fixing hole 26 to fix the circuit board 10 to the case 20.

Figure 7:
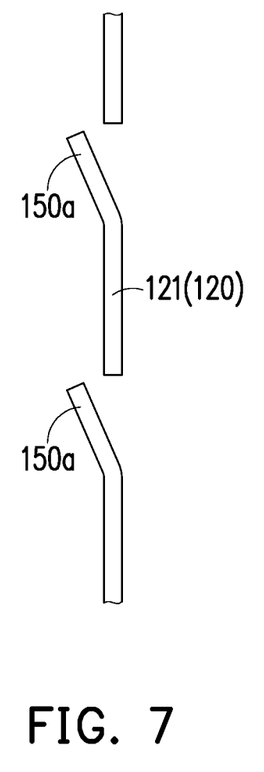
FIG. 7 is a schematic partial cross-sectional view of a shielding sheet according to another embodiment of the invention.

FIG. 7 is a schematic partial cross-sectional view of a shielding sheet according to another embodiment of the invention. Referring to FIG. 7, in the present embodiment, the flexible conductor 150a is a bent elastic piece folded out of a part of the shielding sheet 120. The flexible conductor 150a is adapted to press against the IO ports 12 (shown in FIG. 2). As shown in FIG. 5, when the circuit board fixing hole 14 cannot be aligned with the case fixing hole 26, as long as the assembler pushes the circuit board 10 toward the first wall 23 of the case 20, the flexible conductor 150a in the present embodiment may be pressed toward the shielding sheet 120, so that the circuit board fixing hole 14 is aligned with the case fixing hole 26. Certainly, a type of the flexible conductor 150a is not limited to this.

In view of the above, the floated-type shielding mechanism of the invention is movably disposed on the cover and the back plate through the shielding sheet, and the flexible conductor protrudes from the inner surface of the shielding sheet and is adapted to be deformed. When the circuit board assembly and the floated-type shielding mechanism are assembled into the case, the flexible conductor is adapted to be deformed by pressing and the shielding sheet can move relative to the circuit board, so that the shielding sheet presses against the inner wall surface of the case around the case opening.

What is claimed is:

1. A floated-type shielding mechanism, adapted to be assembled onto a circuit board assembly and assembled into a case together with the circuit board assembly, the circuit board assembly comprising a circuit board and a back plate fixed to a bottom surface of the circuit board, the circuit board comprising a plurality of input/output (IO) ports located on a top surface, and the case comprising a case opening, the floated-type shielding mechanism comprising:

a cover, adapted to be fixed to the circuit board, the cover being located on the top surface and covering above the IO ports;

a shielding sheet, movably disposed at the cover and the back plate, the shielding sheet comprising a plurality of openings, the openings respectively corresponding to the IO ports; and a flexible conductor, deformably protruding from an inner surface of the shielding sheet and adapted to directly contact the IO ports, wherein when the circuit board assembly and the floated-type shielding mechanism are assembled together into the case, the IO ports are exposed from the case opening and the flexible conductor is adapted to be deformed by pressing so that the shielding sheet presses against an inner wall surface around the case opening, the cover covers all of the IO ports, the cover is located within the case, and the cover and the case are not formed integratedly, wherein the shielding sheet comprises a main sheet body and a top sheet body bendably connected to the main sheet body, the IO ports are located on the main sheet body, a first protrusion is provided at one of portions of the top sheet body and the cover facing each other, a first opening is provided on another one of the portions, and the first protrusion is movably disposed in the first opening along a moving direction.

2. The floated-type shielding mechanism according to claim 1, wherein the first protrusion is integrally disposed at the cover, and the first opening is an elongated hole, an oval hole, or a round hole.

3. The floated-type shielding mechanism according to claim 1, wherein the shielding sheet comprises a bottom sheet body bendably connected to the main sheet body, the bottom sheet body is located between the back plate and the circuit board, a second protrusion is provided on one of portions of the bottom sheet body and the back plate facing each other, a second opening is provided on another one of the portions, and the second protrusion is movably disposed in the second opening along the moving direction.

4. The floated-type shielding mechanism according to claim 3, wherein the bottom sheet body comprises a screw hole, the second protrusion comprises a nut, a boss, and a screw body connected in sequence, the screw body of the second protrusion is screwed to the screw hole of the bottom sheet body, and the boss passes through the second opening on the back plate and abuts against the bottom sheet body.

5. The floated-type shielding mechanism according to claim 4, wherein the second opening is an elongated hole or an oval hole, a size of the nut is greater than a width of the second opening, and the width and a length of the second opening are greater than a size of the boss.

6. The floated-type shielding mechanism according to claim 4, wherein the second opening is a round hole, a size of the nut is greater than a size of the second opening, and the size of the second opening is greater than a size of the boss.

7. The floated-type shielding mechanism according to claim 1, wherein the flexible conductor is a conductive foam.

8. The floated-type shielding mechanism according to claim 1, wherein the flexible conductor is a bent elastic piece folded out of a part of the shielding sheet.

9. A circuit board module, adapted to be assembled into a case, the case comprising a case opening located on a first wall and a case fixing hole located on a second wall, the circuit board module comprising:
   a circuit board, comprising a penetrating circuit board fixing hole and a plurality of input/output (IO) ports located on a top surface;
   a back plate, fixed to a bottom surface of the circuit board; and
   a floated-type shielding mechanism according to claim 1, disposed on the circuit board and the back plate, wherein
   when the circuit board, the back plate, and the floated-type shielding mechanism are assembled together into the case, the flexible conductor is adapted to be deformed by pressing so that the circuit board fixing hole is aligned with the case fixing hole and the shielding sheet presses against an inner wall surface around the case opening.

10. A circuit board module, adapted to be assembled into a case, the case comprising a case opening located on a first wall and a case fixing hole located on a second wall, the circuit board module comprising:
   a circuit board, comprising a penetrating circuit board fixing hole and a plurality of input/output (IO) ports located on a top surface;
   a back plate, fixed to a bottom surface of the circuit board; and
   a floated-type shielding mechanism according to claim 2, disposed on the circuit board and the back plate, wherein
   when the circuit board, the back plate, and the floated-type shielding mechanism are assembled together into the case, the flexible conductor is adapted to be deformed by pressing so that the circuit board fixing hole is aligned with the case fixing hole and the shielding sheet presses against an inner wall surface around the case opening.

11. A circuit board module, adapted to be assembled into a case, the case comprising a case opening located on a first wall and a case fixing hole located on a second wall, the circuit board module comprising:
   a circuit board, comprising a penetrating circuit board fixing hole and a plurality of input/output (TO) ports located on a top surface;
   a back plate, fixed to a bottom surface of the circuit board; and
   a floated-type shielding mechanism according to claim 3, disposed on the circuit board and the back plate, wherein
   when the circuit board, the back plate, and the floated-type shielding mechanism are assembled together into the case, the flexible conductor is adapted to be deformed by pressing so that the circuit board fixing hole is aligned with the case fixing hole and the shielding sheet presses against an inner wall surface around the case opening.

12. A circuit board module, adapted to be assembled into a case, the case comprising a case opening located on a first wall and a case fixing hole located on a second wall, the circuit board module comprising:
   a circuit board, comprising a penetrating circuit board fixing hole and a plurality of input/output (JO) ports located on a top surface;
   a back plate, fixed to a bottom surface of the circuit board; and
   a floated-type shielding mechanism according to claim 4, disposed on the circuit board and the back plate, wherein
   when the circuit board, the back plate, and the floated-type shielding mechanism are assembled together into the case, the flexible conductor is adapted to be deformed by pressing so that the circuit board fixing hole is aligned with the case fixing hole and the shielding sheet presses against an inner wall surface around the case opening.

13. A circuit board module, adapted to be assembled into a case, the case comprising a case opening located on a first wall and a case fixing hole located on a second wall, the circuit board module comprising:
   a circuit board, comprising a penetrating circuit board fixing hole and a plurality of input/output (JO) ports located on a top surface;
   a back plate, fixed to a bottom surface of the circuit board; and
   a floated-type shielding mechanism according to claim 5, disposed on the circuit board and the back plate, wherein
   when the circuit board, the back plate, and the floated-type shielding mechanism are assembled together into the case, the flexible conductor is adapted to be deformed by pressing so that the circuit board fixing hole is aligned with the case fixing hole and the shielding sheet presses against an inner wall surface around the case opening.

14. A circuit board module, adapted to be assembled into a case, the case comprising a case opening located on a first wall and a case fixing hole located on a second wall, the circuit board module comprising:
- a circuit board, comprising a penetrating circuit board fixing hole and a plurality of input/output (IO) ports located on a top surface;
- a back plate, fixed to a bottom surface of the circuit board; and
- a floated-type shielding mechanism according to claim 6, disposed on the circuit board and the back plate, wherein
- when the circuit board, the back plate, and the floated-type shielding mechanism are assembled together into the case, the flexible conductor is adapted to be deformed by pressing so that the circuit board fixing hole is aligned with the case fixing hole and the shielding sheet presses against an inner wall surface around the case opening.

\* \* \* \* \*